(12) United States Patent
Bahl et al.

(10) Patent No.: US 6,768,141 B2
(45) Date of Patent: Jul. 27, 2004

(54) HETEROJUNCTION BIPOLAR TRANSISTOR (HBT) HAVING IMPROVED EMITTER-BASE GRADING STRUCTURE

(75) Inventors: Sandeep R. Bahl, Palo Alto, CA (US); Nicolas J. Moll, LaHonda, CA (US); Mark Hueschen, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/226,771

(22) Filed: Aug. 23, 2002

(65) Prior Publication Data

US 2004/0036082 A1 Feb. 26, 2004

(51) Int. Cl.$^7$ ................. H01L 31/072; H01L 31/109
(52) U.S. Cl. ................. 257/197; 257/198; 257/200; 257/183
(58) Field of Search ................. 257/197, 198, 257/200, 183

(56) References Cited

U.S. PATENT DOCUMENTS 5,631,477 A * 5/1997 Streit et al. ................. 257/197
6,462,362 B1 * 10/2002 Miyoshi ................. 257/196

OTHER PUBLICATIONS

Article entitled "Effect of emitter design on the dc characteristics of InP–based double–heterojunction bipolar transistors" by R. Driad, et al.; Institute of Physics Publishing; Semiconductor Science and Technology 16 (2001) p. 171–175.

* cited by examiner

Primary Examiner—Jerome Jackson
Assistant Examiner—Joseph Nguyen

(57) ABSTRACT

A heterojunction bipolar transistor (HBT), including an emitter formed from a first semiconductor material, a base formed from a second semiconductor material, and a grading structure between the emitter and the base is disclosed. The grading structure comprises a semiconductor material containing at least one element not present in the first and second semiconductor materials, where the grading structure has a conduction band energy substantially equal to a conduction band energy of the base at an interface between the base and the grading structure, and where the grading structure has a conduction band energy substantially equal to a conduction band energy of the emitter at an interface between the emitter and the grading structure.

16 Claims, 6 Drawing Sheets

US 6,768,141 B2

HETEROJUNCTION BIPOLAR TRANSISTOR (HBT) HAVING IMPROVED EMITTER-BASE GRADING STRUCTURE

TECHNICAL FIELD

The invention relates generally to transistors, and, more particularly, to heterojunction bipolar transistors.

BACKGROUND OF THE INVENTION

Heterojunction bipolar transistors (HBTs) have become state of the art, particularly in npn form, for applications in which high switching speeds and high frequency operation are desired. Some applications, such as multiplexer (MUX) or demultiplexer (DMUX) circuits for high-speed optical communications, require HBTs with higher switching speed than currently available. Higher switching speed is attained through a combination of operating at higher current density, shrinking the lateral dimensions of the device, and optimizing the epitaxial layers that comprise the HBT.

Popular material systems from which HBTs are constructed include indium phosphide (InP) and indium aluminum arsenide (InAlAs). InP HBTs are constructed using epitaxially grown layers of different semiconductor materials that are lattice-matched, or nearly lattice-matched, to InP.

In particular, a wide bandgap material such as InP or InAlAs is chosen for the emitter layer, and a narrow bandgap material such indium gallium arsenide (InGaAs) is chosen for the base layer.

Unfortunately, when a wide bandgap material and a narrow bandgap material form an abrupt heterojunction, a large conduction band offset is formed at the emitter-base junction. This conduction band offset results in a large energy spike in the conduction band at the emitter side of the junction. This energy spike increases the emitter-base turn-on voltage, limits the maximum current that can be driven through the device, and increases the emitter-base ideality factor. Increased emitter-base turn-on voltage undesirably increases the power dissipation in the HBT. It also decreases the number of transistors that can be stacked in series. An increased ideality factor and reduced current driveability reduce the speed at which logic circuits, or analog circuits such as amplifiers, can operate.

As mentioned above, HBTs can be fabricated using either InP or InAlAs in the emitter layer. To achieve a low turn-on voltage in HBTs having an InAlAs emitter and an InGaAs base, a standard practice is to use a grading layer between the InAlAs body of the emitter and the InGaAs base.

The grading layer provides a smooth energy transition in the conduction band between the InGaAs base and the InAlAs emitter. Most of the grading layer is formed on the emitter-side of the junction and has the effect of reducing or preventing the formation of the energy spike. The thickness of this grading layer is typically in the range of 14 to 40 nanometers (nm). The grading layer can be formed in a variety of ways. For example, in an HBT having an InAlAs emitter and an InGaAs base, an alloy grading layer (comprising a quaternary layer of InAlGaAs) can be inserted between the base and the emitter body. The composition of such a grading layer varies from predominately InAlAs on the emitter side to predominately InGaAs on the base side.

Alternatively, a chirped superlattice, which comprises a series of pairs of thin layers of InGaAs and InAlAs, in which the fraction of the thickness of the InGaAs to the total thickness of the InGaAs and the InAlAs layer in each pair is varied from ~0 on the emitter end to ~1 on the base end, can be used as a grading layer. Further still, instead of a grading layer, a constant-composition layer of InP has also been used between the emitter and base. The latter solution, while providing an emitter base junction that exhibits better electrical characteristics than an abrupt InAlAs/InGaAs emitter-base junction, still fails to provide a good conduction band match to the base material, and still allows an energy spike to form in the conduction band.

An HBT having an InP emitter and an InGaAs base generally exhibits a smaller energy spike at the emitter-base junction than does an HBT having an InAlAs emitter and an InGaAs base. However, using InP in the emitter layer still results in the formation of an abrupt emitter-base junction that has an energy spike. Therefore, structures to reduce the energy spike have also been implemented in a device having an InP emitter. For example, a thin undoped InGaAs setback layer in the base, or a step alloy grading structure comprising two discrete 7 nm InGaAsP layers, or continuous InGaAsP alloy grading (from InP to InGaAs), or a chirped superlattice comprising InGaAs and InP layer pairs are each solutions that have been used to minimize the conduction band energy spike at the emitter-base junction. Unfortunately, using layers of material in which one material includes arsenic and the other material includes phosphorous leads to a large number of arsenide-phosphide interfaces. An arsenide-phosphide interface is difficult to produce and typically result in strained growth, which may lead to dislocations in the epitaxial layers that form the grading structure.

In addition to band energy considerations, the choice of emitter material and structure can affect the passivation of the extrinsic base surface of the HBT, and hence can affect the current gain. One way of effectively passivating the extrinsic base surface is to leave a thin depleted layer of emitter material (typically known as a ledge) in the extrinsic base region. The ledge passivates the surface of the base layer by reducing the recombination of minority carriers injected into the base, which, while negligible at the base-ledge surface, can be very large at an exposed base layer surface.

It is also desirable to minimize the base-collector capacitance and base resistance in an HBT. Many modern HBTs use a self-aligned base contact to minimize the extrinsic base-collector capacitance and base resistance. One common approach to implementing this fabrication technique is to undercut the emitter mesa so that when metallization for the base contact is deposited after emitter mesa formation, a gap between the emitter and the base contact is maintained. In order to form the undercut, the emitter and base should be fabricated so that an etchant can be introduced that removes the emitter material, but not the base (or ledge, if present).

Therefore, there is a need for an HBT having an InP emitter and an InGaAs base, and that exhibits superior emitter-base junction behavior at high current density. Straightforward growth of the epitaxial layers and good etch selectivity between the emitter and surrounding materials are also desired.

SUMMARY OF THE INVENTION

The invention is a heterojunction bipolar transistor (HBT), including an emitter formed from a first semiconductor material, a base formed from a second semiconductor material, and a grading structure between the emitter and the base. The grading structure comprises a semiconductor material containing at least one element not present in the first and second semiconductor materials, where the grading structure has a conduction band energy substantially equal to a conduction band energy of the base at an interface between the base and the grading structure, and where the grading structure has a conduction band energy substantially equal to a conduction band energy of the emitter at an interface between the emitter and the grading structure. The grading structure provides a gradual change in conduction band energy at the emitter-base junction and facilitates selective etching of the grading structure with respect to the emitter.

BRIEF DESCRIPTION OF THE DRAWINGS

The invention, as defined in the claims, can be better understood with reference to the following drawings. The components within the drawings are not necessarily to scale relative to each other, emphasis instead being placed upon clearly illustrating the principles of the invention.

DETAILED DESCRIPTION OF THE INVENTION

While described below using a self-aligned npn heterojunction bipolar transistor (HBT) having an InP emitter and an InGaAs base, the invention is equally applicable to any HBT having a conduction band offset between emitter and base that when properly graded allows the HBT to operate at high current density. Further, the invention is applicable to all HBTs in which high etch selectivity between the emitter and the grading structure is desired.

Figure 1A:
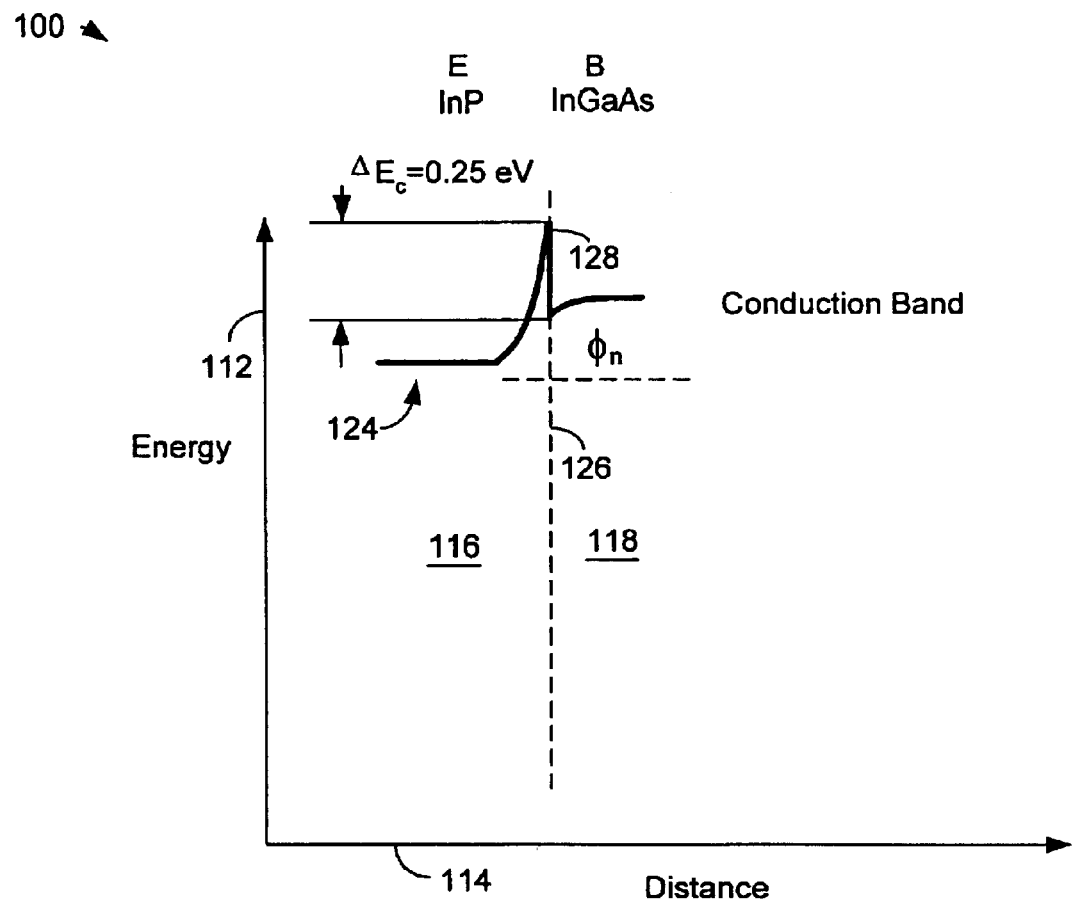
FIG. 1A is a graphical illustration showing an energy band diagram of an HBT having an InP emitter and an InGaAs base an abrupt emitter-base interface.

FIG. 1A is a graphical illustration showing an energy band diagram 100 of a prior art HBT having an InP emitter and an InGaAs base. The vertical axis 112 represents the energy level and the horizontal axis 114 represents distance. The thicknesses of the materials that respectively comprise the emitter region 116 and the base region 118 are depicted on the horizontal axis. If the emitter-base junction 126 is formed as an abrupt heterojunction between the InP material of the emitter and the InGaAs material of the base, an energy discontinuity, $\Delta E_c$, in the conduction band 124 of about 0.25 eV occurs at the emitter-base junction 126. This energy discontinuity leads to an energy spike 128 at the emitter-base junction 126. This energy spike is undesirable for the reasons mentioned above.

Figure 1B:
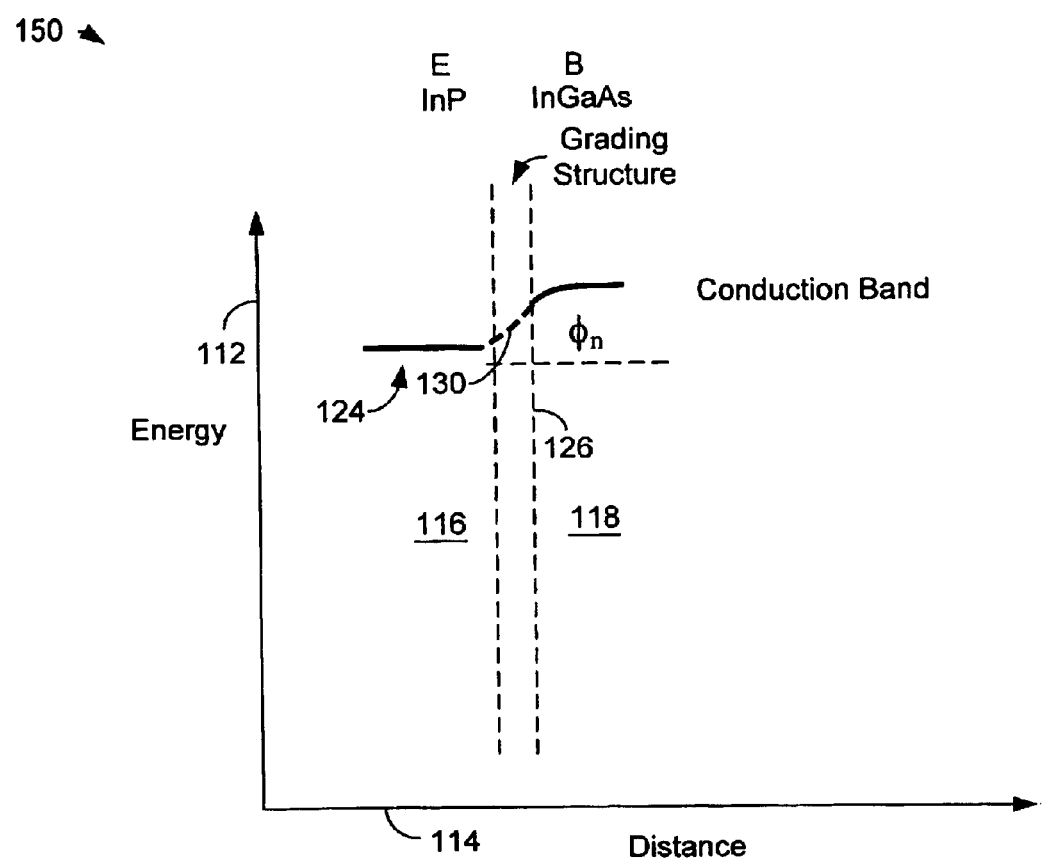
FIG. 1B is a graphical illustration showing an energy band diagram of an HBT having an InP emitter and an InGaAs base showing a graded emitter-base interface in accordance with an aspect of the invention.

FIG. 1B is a graphical illustration showing an energy band diagram 150 of an HBT having a graded emitter-base interface between an InP emitter and an InGaAs base in accordance with an aspect of the invention. To reduce the energy spike, a grading structure is formed between the InP body of the emitter and the InGaAs base. The effect of the grading structure is to reduce the energy spike 128 (FIG. 1A) between the emitter region 116 and the base region 118. The conduction band energy including the grading structure is shown in FIG. 1B by dotted line 130, illustrating a gradual change in conduction band energy at the emitter-base junction.

Figure 2:
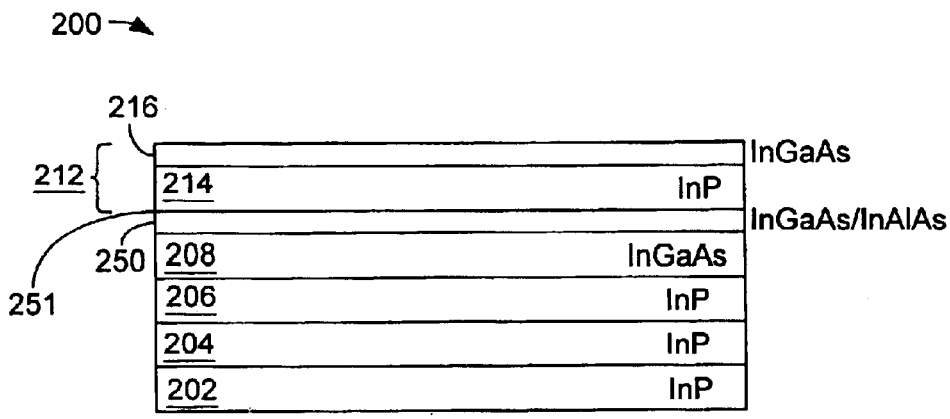
FIG. 2 is a cross-sectional view illustrating relevant portions of a simplified HBT epitaxial layer structure constructed in accordance with an aspect of the invention.

FIG. 2 is a cross-sectional view illustrating the relevant epitaxial layers of a simplified HBT 200 constructed in accordance with an aspect of the invention. The HBT 200 includes an InP substrate 202 over which a heavily n-doped InP subcollector layer 204 is grown. An n-doped collector layer 206 is grown over the subcollector layer 204. The collector layer 206 may be entirely composed of InP, or could be a composite layer comprising InP in the bulk, and an offset, or grading, layer at the top, or could be entirely composed of InGaAs, as known to those having ordinary skill in the art. A heavily p-doped InGaAs base layer 208 is grown over the collector layer 206.

In accordance with one embodiment of the invention, a grading structure 250 including a mixture of semiconductor materials having at least one element that is present neither in the base 208 nor the emitter 212 (to be described below) is grown over the InGaAs base layer 208. The grading structure 250 may have one of a variety of structure types. For example, the grading structure 250 may have a number of alternating layers of different semiconductor material (to be described below in FIG. 3A). Alternatively, another exemplary grading structure may be a layer of a single semiconductor material of varying composition (to be described below in FIG. 3B). Regardless of the structure type, the grading structure 250 includes at least one element that is present in neither the emitter nor the base.

In a preferred embodiment, the grading structure 250 comprises alternating layers of InGaAs and InAlAs having thicknesses that vary. In the preferred embodiment, the element Al is present in neither the emitter body 214, nor the base 208. The grading structure 250 exhibits a conduction band energy that varies from substantially equal to the conduction band energy of the emitter 212 at the emitter-grading structure interface to substantially equal to the conduction band energy of the base 208 at the base-grading structure interface.

One of the benefits of a grading structure 250 formed from the materials described above is that a high degree of etch selectivity is present between the emitter and the grading structure. This allows the emitter to be selectively etched without etching the grading structure, thus enabling the emitter to be formed with a high degree of precision, while not affecting the grading structure. This will be described in greater detail below.

The emitter 212 comprises an n-doped InP emitter body 214 grown over the grading structure 250. The top portion of the emitter body may be heavily n-doped to facilitate contact with a contact layer. A layer of heavily n-doped InGaAs grown over the emitter body 214 forms a contact layer 216.

The material layers that form the HBT 200 can be grown lattice matched to the InP substrate, or can be grown pseudomorphically. Pseudomorphic epitaxial growth, sometimes referred to as "strained growth," results when the bulk lattice constant of the material of a layer differs from the lattice constant of the layer on which it is formed. The lattice constant in a pseudomorphic layer is stretched or compressed so that it matches the lattice constant of the layer on which it is formed in the two dimensions perpendicular to the growth direction. Although the lattice constant in the growth direction will be completely different, the lattice constant presented by the pseudomorphic surface to incoming constituent atoms during growth is the same as a lattice-matched surface. Therefore, physically, the use of a thin pseudomorphic layer is very similar to the use of a perfectly lattice-matched layer.

The composition of the InGaAs in the base layer 208 and the contact layer 216, and the composition of the material in the grading structure 250 are chosen to result in a material having a bulk lattice constant that matches the lattice constant of the InP substrate. This can be accomplished by choosing the ratio of elements of the material of the grading structure such that the bulk lattice constant of the material matches the lattice constant of the substrate. Alternatively, if a different ratio is desired, this can be accomplished by growing the grading structure sufficiently thin to enable pseudomorphic growth while maintaining high crystalline quality. All layers can be grown using, for example but not limited to, molecular beam epitaxy (MBE) or organometallic vapor phase epitaxy (OMVPE).

Figure 3A:
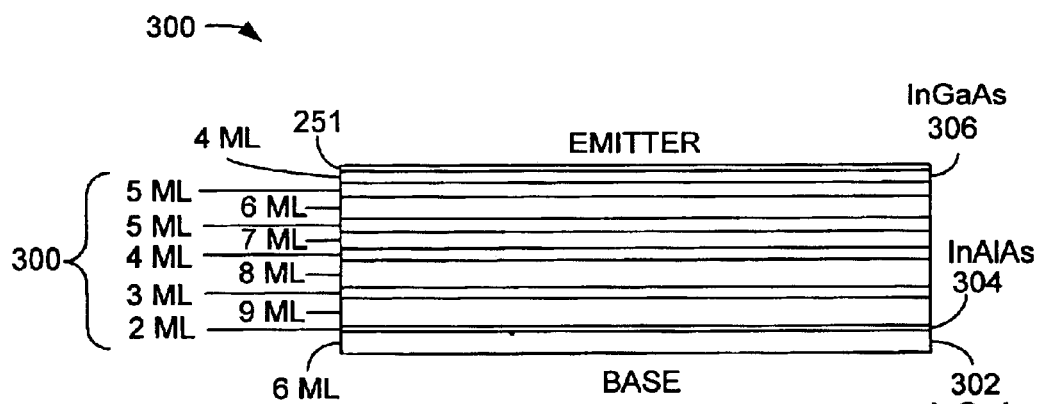
FIGS. 3A and 3B are schematic diagrams illustrating two exemplary embodiments of the grading structure of FIG. 2.
Figure 3B:
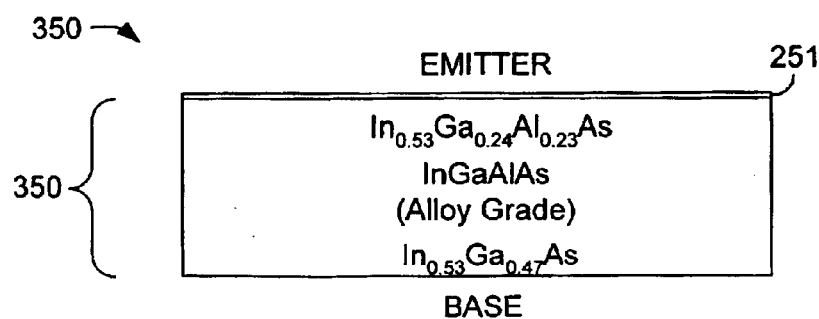

FIGS. 3A and 3B are schematic diagrams illustrating two exemplary embodiments of the grading structure 250 of FIG. 2. FIG. 3A includes a grading structure 300 that includes alternating layers of indium gallium arsenide (InGaAs) and indium aluminum arsenide (InAlAs), examples of which are illustrated using reference numerals 302 and 304, respectively. In the example shown in FIG. 3A, the grading structure 300 comprises six layers of InGaAs alternating with five layers of InAlAs, having thicknesses as shown in Table 1 below.

The thickness of each respective InGaAs and InAlAs layer is stated in monolayers, which, for InP and materials lattice matched to InP, are about 0.293 nm thick. In the embodiment shown in FIG. 3A, the thickness of each layer was chosen by examining calculations done using the Nano-Electronic Modeling program, a quantum mechanical transport simulator known as NEMO. These layers are preferably designed recognizing that electrons have quantum mechanical wavelengths similar to the thickness of the grading structure and its constituent layers, and that quantum mechanical reflection from a poorly chosen grading structure can reduce the electron transmission.

TABLE 1

| InP Emitter | |
| --- | --- |
| InGaAs | 4 monolayers (ML) |
| InAlAs | 5 ML |
| InGaAs | 6 ML |
| InAlAs | 5 ML |
| InGaAs | 7 ML |
| InAlAs | 4 ML |
| InGaAs | 8 ML |
| InAlAs | 3 ML |
| InGaAs | 9 ML |
| InAlAs | 2 ML |
| InGaAs | 6 ML |
| InGaAs Base | |

Layers having a thickness other than those described in Table 1 may also be applicable. The thickness of each InGaAs and InAlAs layer preferrably is chosen to avoid the build-up of interference by quantum mechanical wavefunctions partially reflected at each layer interface, while providing a smooth transition of the average conduction band energy across the grading structure from the base 208 to the emitter body 214. Further, the combination of InGaAs and InAlAs is chosen so that one of the materials is the same as the base layer (208 of FIG. 2, InGaAs), while the other material (InAlAs) includes at least one element (Al) that is found in neither the base nor the emitter. As shown in Table 1, the thickness of the InAlAs layer 304 changes from being thin compared to the thickness of the adjacent InGaAs layer 302 near the base to being similar to the thickness of the InGaAs layer 306 near the emitter. In this manner, a smoothly graded conduction band energy, with negligible energy offset, is achieved between the base and the emitter. In the embodiment shown in FIG. 3A, conduction band energy grading is accomplished by using the relative thickness of the InAlAs and InGaAs layers to grade the effective conduction band energy between the conduction band energy of the InP emitter body 214 (FIG. 2) and the conduction band energy of the InGaAs base layer 208 (FIG. 2).

Such a grading structure includes at least two potential benefits. First, the structure shown in FIG. 3A avoids including a large number of arsenide-phosphide interfaces in the grading structure. This is beneficial because arsenide-phosphide interfaces are difficult to produce and typically result in strained growth, which may lead to dislocations in the epitaxial layers that form the grading structure. In accordance with an aspect of the invention, the only arsenide-phosphide interface is between the grading structure 300 and the emitter 212. That is the interface between the upper InGaAs layer 306 in the grading structure 300 and the emitter body 214 (FIG. 2).

Second, in the preferred embodiment shown in FIG. 3A, a high degree of etch selectivity exists between the InP emitter body 214 and the grading structure. This allows etching of the emitter body but not the grading structure. This etch selectivity also allows undercutting of the emitter layer, which helps in the formation of a ledge, and also prevents emitter-base shorts as will be described below.

FIG. 3B is an alternative embodiment 350 of the grading structure 250. In the embodiment shown in FIG. 3B, a homogenous grading structure 350 preferably includes a composition of indium gallium aluminum arsenide (InGaAlAs) grown using, for example, organometallic vapor phase epitaxy (OMVPE). The homogeneous grading structure is sometimes referred to as an "alloy grade," in which the fraction of one or more of the elements changes through the depth of the layer. Such an alloy grade can, for example, start at a composition close to $In_{0.53}Ga_{0.24}Al_{0.23}As$ near the emitter. Such composition is lattice matched to, and matches the conduction band energy of, InP at the emitter side of the grading structure. The composition can transition to a composition close to approximately $In_{0.53}Ga_{0.47}As$ at the base side of the grading structure. Such an alloy grade 350 provides benefits similar to those of the grading structure 300 shown above in FIG. 3A.

The embodiments shown in FIGS. 3A and 3B are compatible with the well-known use of a sheet charge of dopant atoms at one end of a grading structure to produce an electric dipole field, which further reduces or prevents the formation of an energy spike at the emitter-base interface. It is expected that the use of such a sheet charge of dopant atoms would improve the performance of the grading structure of FIGS. 3A and 3B even further. Such a sheet charge of dopant atoms could comprise donors at a concentration of $3 \times 10^{18}$ donors/centimeter $(cm)^3$ in a 3 nm thick region 251 located at the interface between the emitter body 214 and the grading structure 250.

FIGS. 4A through 4E are schematic diagrams collectively illustrating relevant portions of an HBT 400 constructed in accordance with an aspect of the invention. The HBT 400 includes an InP substrate 402, over which an InP subcollector layer 404 is grown. An InP collector layer 406 is grown over the subcollector layer 404. A p-type InGaAs base layer 408 is grown over the InP collector layer 406. An n-type grading structure 410 is grown over the base layer 408.

Figure 4A:
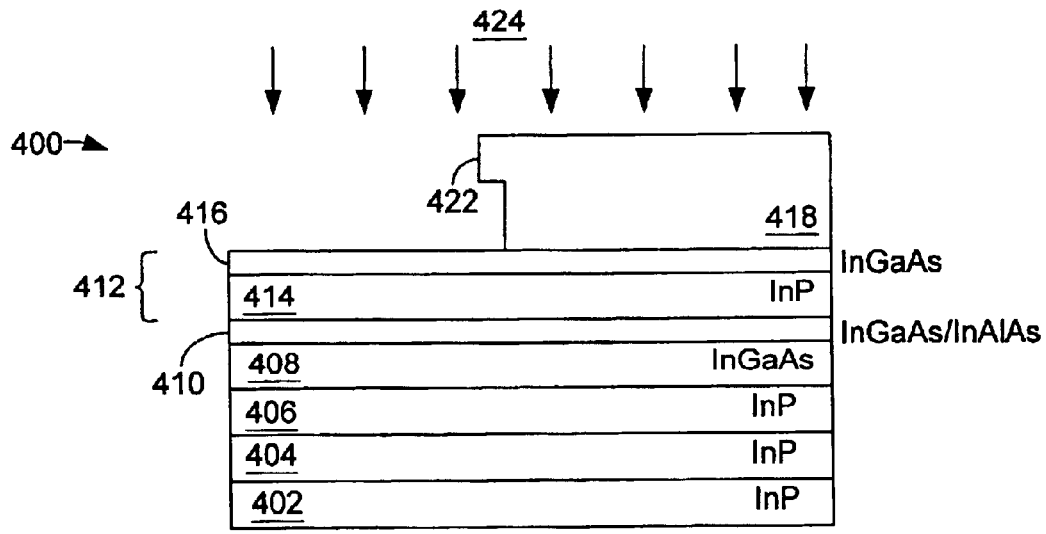
FIGS. 4A through 4E are schematic diagrams collectively illustrating relevant portions of an HBT constructed in accordance with an aspect of the invention.
Figure 4B:
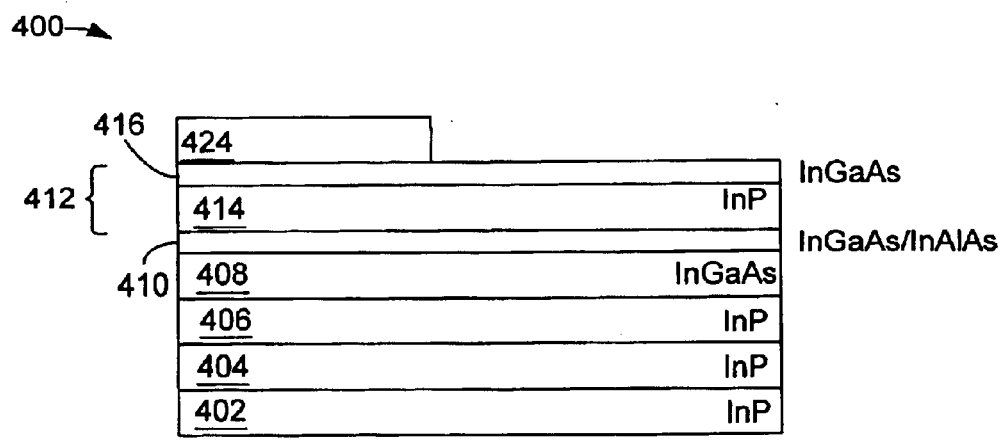

The grading structure 410 may comprise, for example, alternating layers of InGaAs and InAlAs, as described above with respect to FIG. 3A, or an alloy grade comprising InGaAlAs, as described above with respect to FIG. 3B. For exemplary purposes only, the grading structure 410 of FIG. 4A is constructed in accordance with that shown in FIG. 3A, and therefore includes alternating layers of InGaAs and InAlAs The grading structure 410 is doped n-type, and an n-doped emitter body 414 of InP is grown over the grading structure 410. The InP emitter body 414 and a substantial portion of the grading structure 410 are doped in the approximate range of close to 0 to $1 \times 10^{18}$ donors/cm$^3$. The upper surface of the emitter body 414 is doped in the approximately range of 0.1 to $2 \times 10^{19}$ donors/cm$^3$ in order to provide a low resistance contact. An InGaAs contact layer 416 is grown over the emitter body 414.

A photoresist mask 418 including an overhang 422 is applied approximately as shown over the contact layer 416. The overhang 422 in the profile of the photoresist mask 418 facilitates a metal "lift-off" process, which is known in the art of semiconductor device processing.

After the photoresist mask 418 is applied over the contact layer 416 a metal alloy comprising, for example, but not limited to Molybdenum (Mo), Titanium (Ti), Platinum (Pt), and Gold (Au) is deposited over the contact layer 416 and forms the emitter metal 424. The emitter metal 424 is deposited as indicated by the downward pointing arrows in FIG. 4A using, for example, e-beam evaporation as known in the art In FIG. 4B the HBT 400 includes a layer of emitter metal 424 deposited over the contact layer 416. The photoresist mask 418 and the emitter metal deposited thereon have been removed.

Figure 4C:
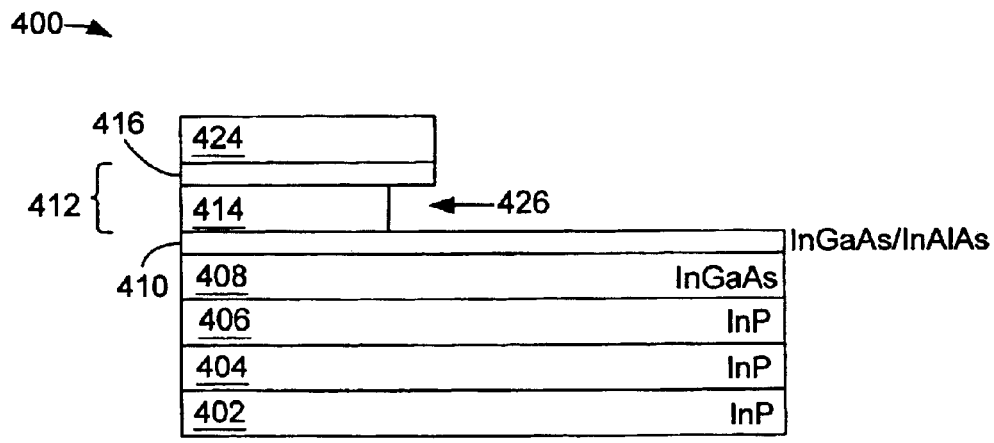

In FIG. 4C, the etch selectivity between the InP emitter body 414 and the grading structure 410 is illustrated. Using the emitter metal layer 424 as a mask, the InGaAs contact layer 416 is etched as shown self-aligned with the emitter metal layer 424. In accordance with an aspect of the invention, the InP emitter body layer 414 is selectively etched, using an etchant that is selective between the material of the emitter body 414 and the grading structure 410. This causes the etch to stop on the grading structure 410. Further, etch selectivity between the InP emitter body 414 and the grading structure 410 allows the emitter body layer 414 to be undercut in the region indicated by arrow 426. A hydrochloric and phosphoric acid based etchant is used to etch the emitter body layer 414 without etching the grading structure 410. This is possible because this etchant does not etch either InGaAs or InAlAs. The undercut of the emitter body 414 (indicated by arrow 426) prevents short-circuiting between the base metal (to be described below with respect to FIG. 4E) and the emitter metal 424 when the base metal is deposited.

Figure 4D:
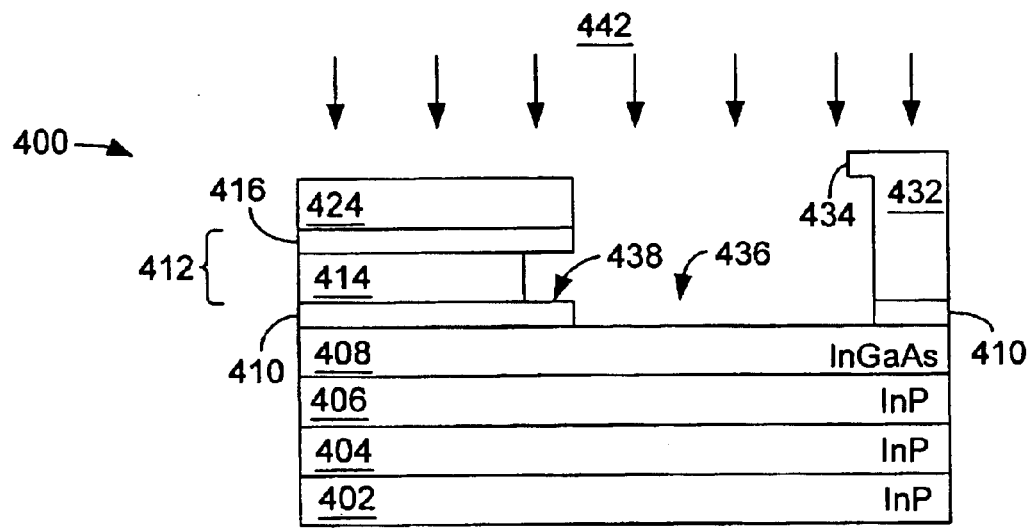

In FIG. 4D a photoresist mask 432 including an overhang 434 is applied over the grading structure 410. After the photoresist mask 432 is applied, and using the emitter metal layer 424 as a mask, the grading structure 410 is etched, thus exposing the portion of the base layer 408 in the region indicated using arrow 436. The grading structure 410 is etched using, for example but not limited to, reactive ion etching (RIE) so that a distinct ledge 438 is created in the grading structure 410.

The ledge 438 in the grading structure 410 passivates the top surface of the base layer 408 in the vicinity of the emitter body 414, thus reducing the likelihood of recombination of minority carriers that would be injected into the base layer 408 were the surface of the base layer 408 exposed. By eliminating the exposed base surface (i.e., by including a ledge 438), the recombination of minority carriers is minimized, thus improving the current gain and improving the overall performance of the HBT 400.

After the grading structure 410 is removed in the region 436, a base metal 442 comprising, for example, but not limited to Mo, Ti, Pt, and Au is deposited over the surface of the HBT 400 as indicated by the downward pointing arrows. The base metal 442 is deposited using, for example, e-beam evaporation as known to those having ordinary skill in the art. The HBT 400 is then immersed in a solvent to dissolve the photoresist mask 432.

Figure 4E:
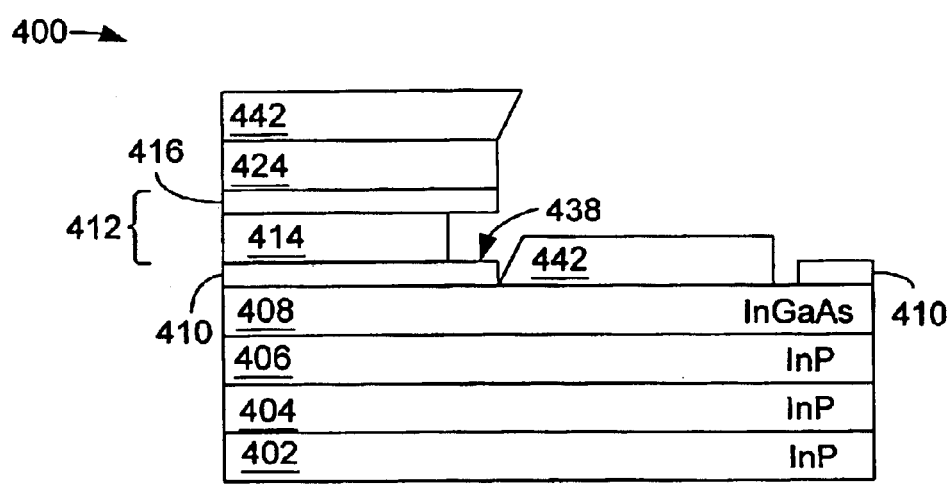

In FIG. 4E, the HBT 400 includes a layer of base metal 442 deposited over the exposed portion of the base layer 408 that was revealed through the opening between the photoresist mask 432 and the emitter metal 424 (FIG. 4D). A layer of base metal 442 also appears over the emitter metal 424 in accordance with normal device processing.

Figure 5:
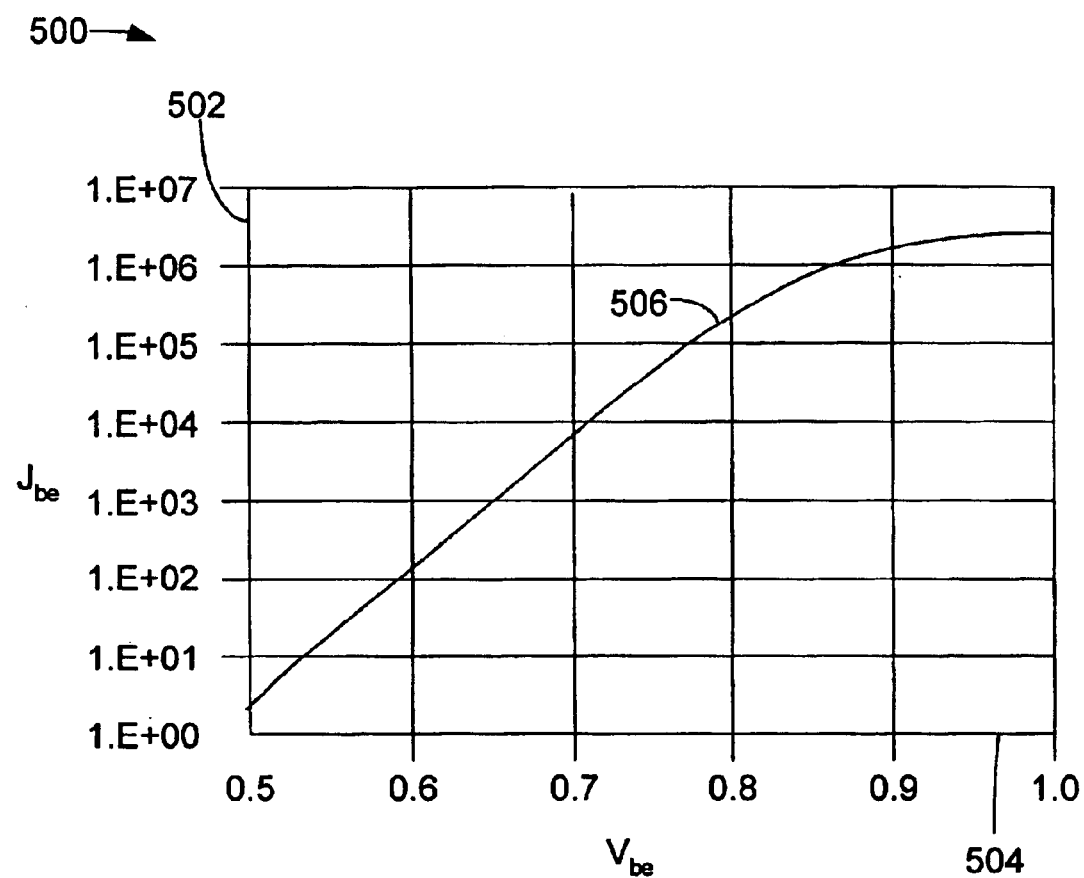
FIG. 5 is a graphical illustration showing the emitter current density for an HBT constructed in accordance with an aspect of the invention.

FIG. 5 is a graphical illustration 500 showing the emitter current density for an HBT constructed in accordance with an aspect of the invention. The vertical axis represents current density, Jbe, in amps per square cm of emitter surface area (A/cm$^2$) while the horizontal axis 504 represents emitter base voltage, Vbe. As shown in FIG. 5, the curve 506 illustrates the high current density at emitter base voltages over 0.8 volts possible with an HBT 400 constructed as illustrated above. Without the grading structure, the curve 506 would start to bend over by approximately 105 A/cm$^2$ instead of approximately 106 A/cm$^2$ as shown in FIG. 5.

It will be apparent to those skilled in the art that many modifications and variations may be made to the embodiments of the present invention, as set forth above, without departing substantially from the principles of the present invention. For example, both npn and pnp HBTs using both self-aligned and non-self-aligned fabrication processes can benefit from the concepts of the invention. All such modifications and variations are intended to be included herein within the scope of the present invention, as defined in the claims that follow.

What is claimed is:

1. A heterojunction bipolar transistor (HBT), comprising:
   an emitter formed from a first semiconductor material;
   a base formed from a second semiconductor material; and
   a grading structure between the emitter and the base, the grading structure comprising a semiconductor material containing at least one element not present in the first and second semiconductor materials, where the grading structure has a conduction band energy substantially equal to a conduction band energy of the base at an interface between the base and the grading structure, and where the grading structure has a conduction band energy substantially equal to a conduction band energy of the emitter at an interface between the emitter and the grading structure.

2. The HBT of claim 1, wherein the emitter is formed of InP, the base is formed of InGaAs, and the grading structure comprises alternating layers of InGaAs and InAlAs.

3. The HBT of claim 1, wherein the emitter is formed of InP, the base is formed of InGaAs, and the grading structure comprises a layer of graded composition InGaAlAs.

4. The HBT of claim 3, wherein the layer of graded composition InGaALAs has a composition that substantially matches a conduction band energy of InP at the emitter side of the grading structure, and has a composition that substantially matches a conduction band energy of InGaAs at the base side of the grading structure.

5. The HBT of claim 1, wherein the grading structure has etch selectivity with respect to the emitter.

6. The HBT of claim 1, further comprising a sheet charge of dopant atoms located between the emitter and the grading structure.

7. A method for making a heterojunction bipolar transistor (HBT), the method comprising:

forming an emitter from a first semiconductor material;

forming a base from a second semiconductor material; and forming a grading structure between the emitter and the base, the grading structure comprising a semiconductor material containing at least one element not present in the first and second semiconductor materials, where the grading structure has a conduction band energy substantially equal to a conduction band energy of the base at an interface between the base and the grading structure, and where the grading structure has a conduction band energy substantially equal to a conduction band energy of the emitter at an interface between the emitter and the grading structure.

8. The method of claim 7, wherein:

the emitter is formed of InP, the base is formed of InGaAs; and the grading structure is formed of alternating layers of InGaAs and InAlAs.

9. The method of claim 7, wherein:

the emitter is formed of InP;

the base is formed of InGaAs; and the grading structure is formed of a layer of graded composition InGaAlAs.

10. The method of claim 7, further comprising selectively etching the grading structure with respect to the emitter.

11. The method of claim 7, further comprising forming a sheet charge of dopant atoms between the emitter and the grading structure.

12. A grading structure for a heterojunction bipolar transistor (HBT), the grading structure comprising a semiconductor material containing at least one element not present in an emitter or a base of the HBT, where the grading structure has a conduction band energy substantially equal to a conduction band energy of the base at an interface between the base and the grading structure, and where the grading structure has a conduction band energy substantially equal to a conduction band energy of the emitter at an interface between the emitter and the grading structure.

13. The grading structure of claim 12, wherein the grading structure comprises alternating layers of InGaAs and InAlAs.

14. The grading structure of claim 12, wherein the grading structure comprises a layer formed of graded composition InGaAlAs.

15. The grading structure of claim 14, wherein the grading structure formed of graded composition InGaAlAs has a composition that substantially matches a conduction band energy of InP at the emitter side of the grading structure, and has a composition that substantially matches a conduction band energy of InGaAs at the base side of the grading structure.

16. The grading structure of claim 12, wherein the grading structure has etch selectivity with respect to the emitter.

* * * * *